Sept. 1, 1970 J. V. STOVER ET AL 3,526,788

SERIALLY-CONNECTED COMPLEMENTARY TRANSISTOR PAIR SWITCHING CIRCUIT

Filed May 31, 1966 3 Sheets-Sheet 1

Joe V. Stover,
George Sloan,
INVENTORS.
BY.
J. K. Haskell,
ATTORNEY.

Sept. 1, 1970 J. V. STOVER ET AL 3,526,788

SERIALLY-CONNECTED COMPLEMENTARY TRANSISTOR PAIR SWITCHING CIRCUIT

Filed May 31, 1966 3 Sheets-Sheet 2

Sept. 1, 1970 J. V. STOVER ET AL 3,526,788

SERIALLY-CONNECTED COMPLEMENTARY TRANSISTOR PAIR SWITCHING CIRCUIT

Filed May 31, 1966 3 Sheets-Sheet 3

United States Patent Office 3,526,788
Patented Sept. 1, 1970

3,526,788

SERIALLY-CONNECTED COMPLEMENTARY TRANSISTOR PAIR SWITCHING CIRCUIT

Joe V. Stover, Fullerton, and George Sloan, Anaheim, Calif., assignors to Hughes Aircraft Company, Culver City, Calif., a corporation of Delaware Filed May 31, 1966, Ser. No. 554,028
Int. Cl. H03k *17/00*
U.S. Cl. 307—255 13 Claims

ABSTRACT OF THE DISCLOSURE

A high voltage/high power switching circuit has two or more transistor circuit stages, each of which includes a pair of transistors in a regenerative loop to provide high speed switching in which the rise and fall time of the switched voltage is independent of the load voltage pulse width. The pair of transistors in each stage is preferably a complementary pair.

BACKGROUND

This invention relates to switching circuitry, and more particularly, to a circuit for controlling the supply of energy to a load from a source of electric energy.

At present, most switching circuits used to control the flow of electric energy, such as provided by a voltage source, employ high vacuum or gas discharge type switching tubes. The impedance across such tubes, which are generally connected in series with the load across the voltage source, is made to vary as a function of their state of conduction, thereby varying the impedance connected in series with the load which affects the voltage applied thereto. Circuits, for switching high voltage, high power have also been designed employing conventional low power transistors. However, such circuits have been found to be of limited use because of the overall complexity of design, requiring a plurality of drive coupling networks and high drive power requirements.

Briefly, in the prior art of high voltage, high power switching circuits, a plurality of low voltage transistors are connected in series with each other as well as with the load. These transistors are switched between conducting and nonconducting states. In the conducting state, the transistors provide a minimum of impedance in series with the load, so that most of the high voltage is applied thereacross, while in the nonconducting state, the transistors provide a high impedance in series with the load, so that most of the high voltage from the source is across the transistors. These transistors, which generally require matching of critical device characteristics, are shunted by resistor and capacitor networks to aid in equalizing distribution of voltages across the serially connected transistors during the nonconducting or OFF period, as well as during the transition times between one state and the other. Prior art circuitry generally requires that drive power be supplied to the base to emitter junction of each of the transistors during the pulse duration when the transistors are switched to their conducting or ON state. Thus, a separate base drive coupling network must be provided for each of the transistors, which together with the drive power for each transistor result in a relatively complex circuit.

Other limitations of prior art switching circuits employing low voltage transistors for switching high voltage, high power includes the dissimilar performance characteristics and bandwidth limitations of the base drive coupling networks associated with each transistor. These undesirable characteristics of the base drive networks limit the fidelity of the load voltage waveshape. Also, since these base drive coupling networks must supply base drive power throughout the duration of the load voltage waveshape, the achievable minimum load voltage rise and fall times are directly related to the load voltage pulse width.

It is therefore an object of the present invention to provide a new switching circuit which is not limited by the prior art disadvantages.

Another object of the present invention is the provision of a new transistorized circuit for switching high voltage, high power with low voltage transistors.

Yet another object of the present invention is to provide a new transistorized circuit requiring a minimum of drive power to drive low voltage transistors to control the switching of high energy.

A further object of the present invention is the provision of a voltage switching circuit, employing low voltage transistors requiring a minimum of circuitry for switching the transistors from one state of conduction to the other.

Yet a further object of the present invention is to provide a highly reliable switching circuit employing low voltage transistors in which the danger of failure of any of the transistors due to non-uniform voltage distribution is greatly minimized.

Still a further object of the present invention is to provide a switching circuit, for switching high voltage, high power between a voltage source and a load at a relatively high rate with the rise and fall time of the switched voltage being independent of the load voltage pulse width.

Still a further object is the provision of a transistorized switching circuit whereby energy is switchable to a load for a predetermined duration, which is electronically variable over a wide range.

These and other objects of the invention are achieved by providing a switching circuit comprising two or more transistorized circuit stages, each including a pair of transistors interconnected to form a regenerative closed loop. When the product of the current gains of the two transistors in each stage is equal to or greater than unity, an unstable condition exists, tending to drive the two transistors into conduction, thereby providing a low impedance thereacross. After the transistors are switched to their conducting states, no additional base drive current is required to maintain the transistors in their conducting state. Thus the need present in the prior art of providing continuous base drive power to maintain the conduction state for each transistor or stage is eliminated in the circuitry of the present invention. In addition, by driving the transistors in one stage to their conducting state, the current to the other stages is automatically increased which causes the transistors in the other stages to conduct. Consequently, the need for a separate base drive coupling network for each stage is eliminated.

To restore the transistors in each circuit stage to their nonconducting state, it is merely necessary to momentarily reduce the magnitude of the total current gain of the transistors in one of the circuit stages to less than unity. Once the transistors in one of the stages are switched to their nonconductive states, a similar effect occurs in the transistors in the other stages, so that all the transistors are switched to their nonconductive states. As a result, each of the stages provides a high impedance thereacross so that the total impedance in series with the load is greatly increased, thereby substantially reducing the voltage applied to the load. On the other hand, when the transistors of the various stages are in their conductive states, each circuit stage provides a relatively low impedance in series with the load, so that the total impedance of the transistor circuit is quite small, thereby enabling the application of a higher voltage to the load.

The novel features that are considered characteristic of this invention are set forth with particularity in the appended claims. The invention itself both as to its organization and method of operation, as well as additional objects and advantages thereof, will best be understood from the following description when read in connection with the accompanying drawings.

DESCRIPTION

Figures 1, 6:
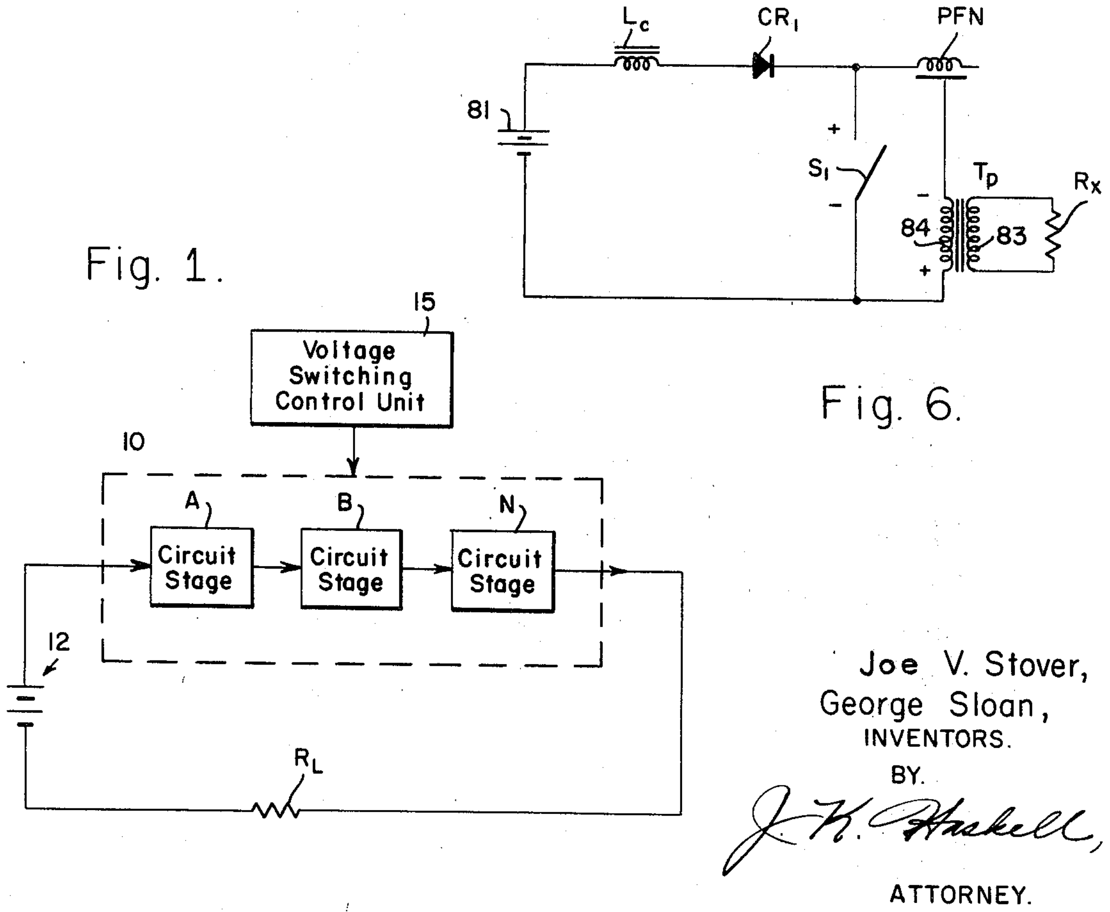
FIG. 1 is a simplified block diagram useful in explaining the application of the switching circuit of the present invention.
FIG. 6 is a simple diagram of another arrangement in which the switching circuit of the invention may be employed.

Attention is now directed to FIG. 1 which is a simplified block diagram useful in describing the function of the switching circuit of the present invention, as well as some of the principles of operation thereof. In FIG. 1, a switching circuit 10 is shown connected in series with a voltage source such as battery 12 and a load generally designated $R_L$. Though the load shown is resistive, other nonresistive loads may be employed. Also the voltage source may be replaced by a current source. Thus even though the invention hereafter will be described in conjunction with a voltage source, it should be assumed to generally represent a source of electrical energy. The switching circuit is shown comprising a plurality (three) of circuit stages, designated A, B and N. A voltage switching control unit 15, which will be described hereinafter in detail, is shown connected to the switching circuit 10.

Briefly described, the function of the switching circuit 10 is to control the voltage from source 12 applied to the load $R_L$ by means of varying the resistance or impedance across the circuit 10. Each of the circuit stages, as will be described hereinafter in detail, comprises a pair of transistors interconnected to form a regenerative closed loop circuit in which the two transistors are switched to be in either of two stable states of operation, one hereafter referred to as a conducting state and the other the nonconducting state. When the transistors are in a conducting state, the impedance across each circuit stage is low, so that the total impedance across the switching circuit 10 is relatively low and therefore most of the voltage from source 12 is applied to the load. On the other hand, when the transistors in each of the circuit stages are in their nonconducting state, the impedance across each circuit stage is relatively high and therefore the total impedance of the switching circuit 10 is quite large so that most of the voltage from source 12 is applied across the switching circuit 10, rather than the load $R_L$.

The switching of the transistors of the various circuit stages from their nonconductive to their conductive state is accomplished by signals from the voltage switching control unit 15. Such signals may take the form of a first control pulse, hereafter also referred to as the ON pulse, applied to a control network, which may be coupled to one or more of the circuit stages in such a manner as to increase the product of the current gain of the two transistors in the stage to unity or greater. Once this condition is achieved, the two interconnected transistors form a regenerative closed loop whereby the two transistors remain in their conductive state until the product of their current gain is reduced to below unity.

The impedance across the particular circuit stage, the transistors of which are in a conductive state, is greatly reduced so that the voltage is redistributed over the other circuit stages. Due to the change in voltage thereacross, sufficient transistor junction capacitance, displacement current is provided to increase the gain in each one of the other circuit stages to switch their respective transistors to their conductive states. Thus, all the transistors of the various circuit stages are switched to their conductive states. This results in a relatively low impedance across each one of the stages and therefore across the entire switching circuit 10 so that most of the voltage from source 12 is applied to the resistive load. Once the transistors in each stage are in their conductive states, they remain in such state until the total current gain in the stage is distributed and reduced to below a predetermined value, such as unity, thereby switching the transistors to their nonconductive or OFF state. Thus, the ON pulse, necessary to initiate the switching of the transistors to their conductive state need only be applied during a short time duration sufficient to increase the gain of one of the stages to the value where regenerative closed loop action occurs, rather than during the entire duration that the transistors are to be in their conductive state, as in the case in prior art switching circuits.

As herebefore indicated, once the transistors are switched to their conductive state, they remain in such state until the total gain in one of the stages is reduced to a value below the predetermined value, such as unity. When this occurs, the transistors in that particular stage tend to switch to their nonconductive state, thereby increasing the impedance thereacross which in turn affects the current in the other stages which results in a similar switching of the transistors in the other stages from their conducting to their nonconductive state. Reducing total current gain in one of the stages, so as to initiate the switching of the transistors to an OFF state, may be accomplished by providing a second control pulse, hereafter also referred to as the OFF pulse from the voltage switching control unit. Such pulse may be applied to one or more of the circuit stages, so as to reduce the base current in one of the transistors therein and thereby reduce the total current gain in the regenerative closed loop. The OFF pulse should be of sufficient duration to gradually reduce the current gain and the transistors of the particular stage which is being switched to its nonconductive state so that the effect of such switching OFF is sensed by the other stages of the circuit.

Figure 2:
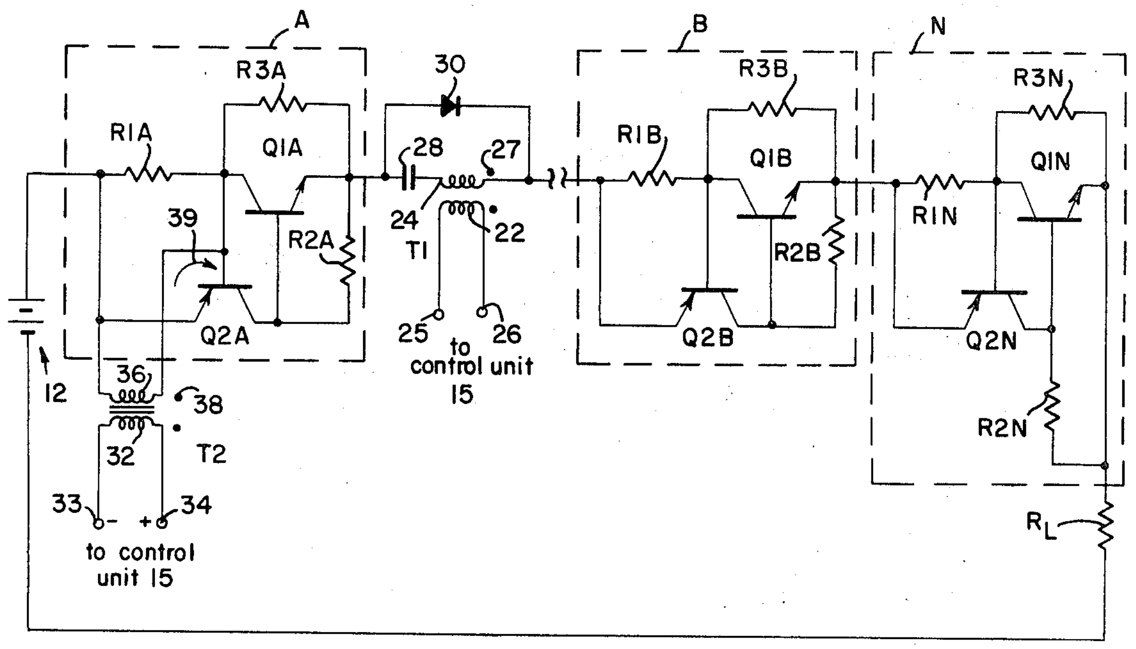
FIG. 2 is a schematic diagram of one embodiment of the invention.

For a better understanding of the teachings of the present invention, reference is now made to FIG. 2 which is a schematic diagram of one embodiment of the invention actually reduced to practice. In FIG. 2, as well as in the other figures, the novel switching circuit of the invention will be described in conjunction with three (A, B and N) circuit stages. However, it should be appreciated that the switching circuit may include any number of N circuit stages and need not be limited to the specific number, shown herein for explanatory purposes. As seen in FIG. 2, circuit stage A comprises an NPN transistor designated Q1A and a PNP transistor, designated Q2A, with the base electrode of each transistor connected to the collector electrode of the opposite transistor. The emitter of transistor Q2A is connected to the collector of transistor Q1A through a resistor R1A while a resistor R2A is connected between the emitter of transistor Q1A and the collector of transistor Q2A. A single resistor R3A is shown connected across the collector and emitter of transistor Q1A. Circuit stages B and N are identical to circuit stage A, including identical elements, designated by like numerals, followed by the respective letter designation.

As previously indicated, in accordance with the teachings of the present invention, the transistors in each stage are switched to their conductive state by increasing the product of the current gain thereof to a preselected value, such as unity, which once achieved, is sufficient to maintain the two transistors in a regenerative conducting closed loop.

The product of the total current gain of the two transistors in any of the circuit stages may be increased by any one of a plurality of different techniques. One method is to increase the base current of either of the two transistors by the addition of an external drive signal so as to increase the gain of that particular transistor and therefore the product of the current gain of the two transistors in the stage. Another technique is to increase the transistors' base to collector or collector to emitter voltage excessively, known as an avalanche condition which produces sufficient collector current, thereby increasing the transistors' current gain. A further technique includes the increase of the junction temperature of the transistors excessively to increase the current gain thereof or by providing a transient flow of transistor junction capacitance displacement current of sufficient magnitude to raise the product of the current gain in any of the stages to the minimum level necessary to maintain the two transistors in a regenerative closed loop.

In the embodiment diagrammed in FIG. 2, switching the transistors to their conductive state is assumed to be accomplished by means of avalanche turn on. That is, the transistors in each of the stages are switched to their conductive state by excessively increasing the collector to emitter voltage across the transistors in each of the circuit stages. This is accomplished by means of a transformer T1 having a primary winding 22 and a secondary winding 24 connected in series with the voltage source 12. The primary winding 22 is assumed to be connected to the voltage switching control unit 15 (FIG. 1) by means of terminals 25 and 26 respectively. In accordance with the teachings of the present invention, unit 15 supplies the primary winding 22 with a pulse which drives the terminal of the secondary winding 24, indicated by the conventional winding dot 27, to a positive potential with respect to the other end of the winding. The amplitude of the pulse from unit 15 is chosen to be great enough so that the potential difference or voltage across secondary winding 24 added to the voltage across the voltage source 12 is enough when distributed over the plurality of circuit stages to provide a collector to emitter voltage difference large enough to produce an avalanche condition in one or more of the transistors.

Alternatively stated, the amplitude of the ON pulse from the control unit 15 should be large enough so that the ON pulse amplitude across secondary winding 24, added to the supply voltage of source 12 will initiate, due to the avalanche condition across one or both of the transistors, the flow of leakage currents through the transistors sufficient to cause their current gain products to be equal to or greater than unity. It should be pointed out that the duration of the ON pulse need be of only limited time, sufficient to produce the increase in the product of the current gain of one of the stages, so that the transistors in one or more of the stages are switched to their conductive states. However, once such switching occurs, the transistors remain in their conductive state irrespective of the presence or absence of the ON pulse. Such an arrangement is materially different from prior art arrangements in which the ON pulse must be of a duration essentially equal to the time required for the transistors to be in their conductive state, or the time during which high voltage is to be supplied to the load.

Because the rise and fall time of the output of each base drive coupling network, used in the prior art circuits to drive the transistors to conduction, is directly related to the duration of the ON pulse, it should be realized that the rise and fall time of the voltage applied to the load depends on the ON pulse duration. The longer the ON pulse, the longer are the rise and fall time of the voltage across the load. However, in the present invention, since the ON pulse is used only to trigger the switching of the transistors to their conducting state and is not needed to maintain such condition, an ON pulse of very short duration can be used so as to minimize the rise and fall time of the voltage across the load. This rise and fall time is the same irrespective of the duration during which the voltage is applied to the load. Because of such characteristic, the circuit of the invention may be operated to vary the duration during which voltage is applied to the load over a very wide range, this without changing the rise and fall time of the voltage waveshape.

When the transistors in each state are in their conductive state, they provide a low impedance path across their respective stage, so that the total impedance of the plurality of stages, i.e., the total impedance of the switching circuit is relatively low so that most of the voltage from voltage source 12 is applied to the load $R_L$. When employing the transformer T1, having its secondary winding connected in series with the voltage source 12, the operation may be enhanced by connecting a blocking condenser 28 in series with the winding 24, as well as a diode 30 connected across the blocking capacitor and the secondary winding so as to provide a low impedance for the flow of direct current therethrough.

As previously indicated, once the various circuit stages are in their conductive state, i.e., providing a low impedance thereacross so that most of the voltage from source 12 is applied to the load $R_L$, they remain in such state until the total product current gain in one of the stages is reduced below unity which causes the transistors in the particular stage, as well as those in the other circuit stages, to be switched to their nonconductive state. The reduction of the product of the current gain in any of the stages to a value below unity may be accomplished by reducing the base current of any of the conducting transistors. For example, as seen in FIG. 2, assuming stage A to be in a conductive state, the transistors thereof may be switched to a nonconductive state merely by reducing the base current of transistor Q2A, sufficient to reduce the product of the current gain of transistors Q1A and Q2A to below unity and thereby cause the two transistors, as well as the transistors of the other stages, to be switched to their nonconductive state.

To accomplish such base curent reduction, in accordance with the teachings of the present invention, a second transformer T2 is provided having a primary winding 32 connected to the voltage switching control unit 15 by means of terminals 33 and 34. Transformer T2 also includes a secondary winding 36 connected across the base and emitter junction of the PNP transistor Q2A. By applying a pulse, hereafter also referred to as the OFF pulse, from control unit 15 to the primary winding 32 so that the terminal of the secondary winding 36, designated by the winding dot 38, is positive with respect to the opposite terminal of the secondary winding, a reverse base current is caused to flow through the base junction of the PNP transistor, thereby reducing the base current thereof.

Such reduction is chosen to be of sufficient magnitude to reduce the overall current gain of the two transistors in stage A so that the two transistors are switched to their nonconductive state. As stage A is switched to its nonconductive state, the impedance thereacross and therefore the voltage thereacross increases, thereby reducing the current supplied to the other conducting stages which results in the reduction of current gain therein with the subsequent switching of the transistors thereof to their nonconducting states.

Defining the current gain of the two transistors in each stage such as QIA and Q2A as $\beta_1$ and $\beta_2$ respectively, the transistors are interconnected to switch from their nonconductive to their conductive state when $\beta_1\beta_2 \geqq 1$, i.e., the product of their current gain is equal to or greater than unity. The transistors remain in their conductive state when $$\beta_1\beta_2=\frac{i_{c1}}{i_{b2}}$$

where $i_{c1}$ represents the collector current of transistor Q1A and $i_{b2}$, the base current of Q2A. Switching of the transistors to their nonconductive state is accomplished by reducing the product of the current gain to less than unity, i.e., $\beta_1\beta_2<1$.

Figure 3:
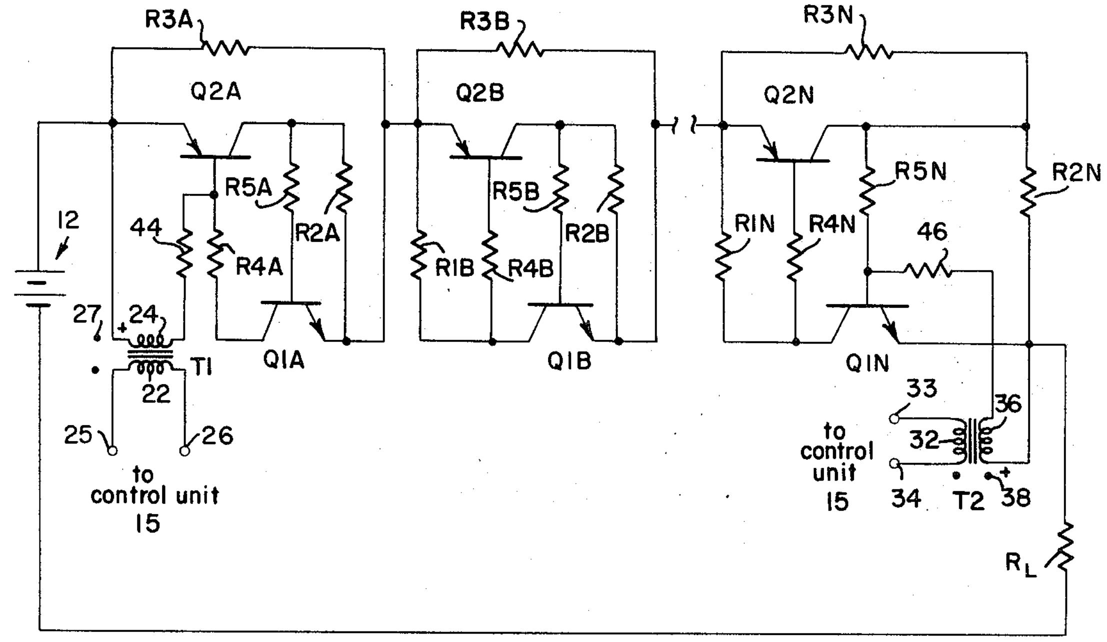
FIG. 3 is a schematic diagram of another embodiment of the invention.

Attention is now directed to FIG. 3 which is another embodiment of the invention in which the transistor junction capacitance characteristics and the associated displacement current are employed, to effect a transition of the transistors from a nonconducting or OFF state to a conducting or ON state. In FIG. 3, like elements to those hereinbefore described are designated by like numerals. Whereas in the embodiment shown in FIG. 2 the NPN transistors of the various circuit stages carry the predominant current from the voltage source 12 to the load, in the embodiment shown in FIG. 3, the PNP transistors are the predominant current carriers. In addition, in the embodiment shown in FIG. 3, resistors, such as R4A and R5A are connected between the base and collector electrodes of the PNP transistor and the collector and base electrodes respectively of the NPN transistor. These resistors are chosen to compensate for the different intrinsic transistor parameters so that the two transistors can be maintained in their conductive state or ON state without having to carefully select transistors with matching parameters.

In FIG. 3, the dotted end of secondary winding 24 is shown connected to the emitter electrode of the PNP transistor Q2A of stage A, while the other terminal of the secondary winding is connected through a resistor 44 to the base of the same transistor. Also, the dotted end of the secondary winding 36 is connected to the emitter electrode of the NPN transistor Q1N of the last stage, while the other end of winding 36 is connected through a resistor 46 to the base of the same transistor. For explanatory purposes, it will be assumed that turn ON and turn OFF of the transistors will be accomplished by the application of turn ON and turn OFF pulses to the primary windings 22 and 32 of the transformers T1 and T2 respectively, from the voltage switching control unit 15 (FIG. 1).

The two transistors of circuit stage A may be initially turned on by applying an ON control pulse to the input terminals 25 and 26 of primary winding 22. The pulse polarity is chosen so that the end of secondary winding 24, indicated by dot 27, is positive with respect to the other end thereof. Consequently, the base current in PNP transistor Q2A is increased, so that when the product of the current gain of the two transistors in stage A reaches unity or greater, the two transistors are switched to their conducting state. As a result, the voltage drop across stage A is minimized and the remaining transistors of the remaining stages (B and N) suddenly find the total supply voltage of source 12 appearing across themselves. That is, the rate of voltage change across stage A is equal to the rate of voltage change across the other circuit stages, except that the voltage across stage A is decreasing, while the voltage across the other stages is increasing at the same rate.

Figure 4:
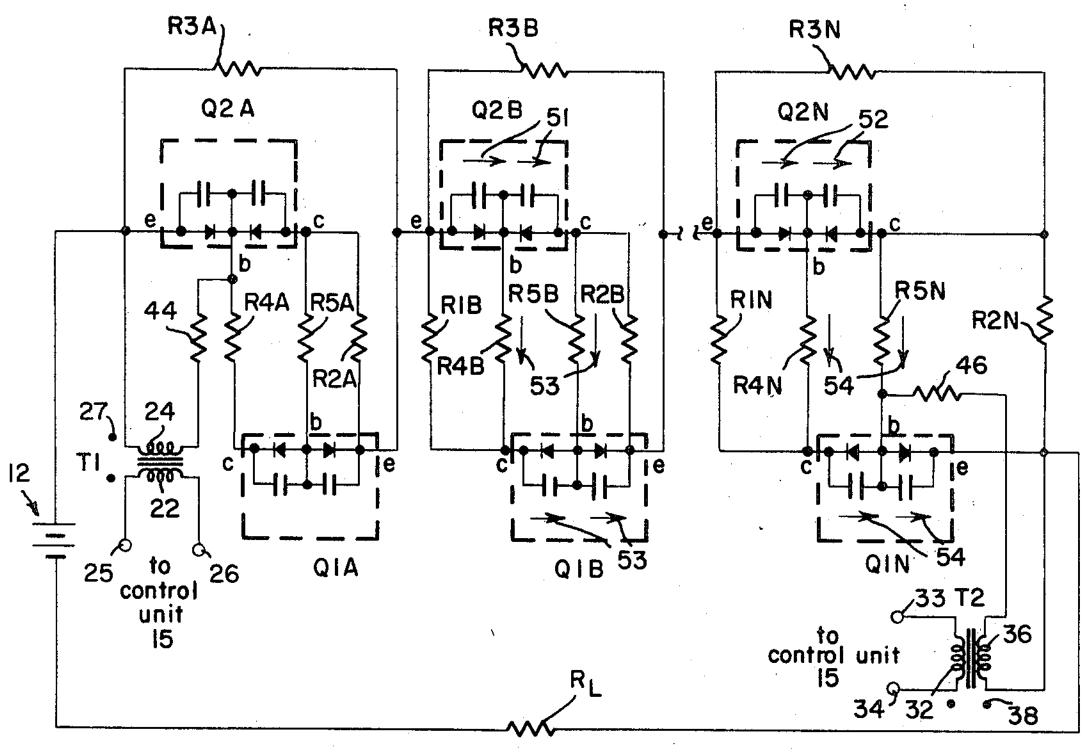
FIG. 4 is a schematic diagram useful in explaining the embodiment of FIG. 3.

The rate of change of voltage across the other stages is in such a direction as to charge the base to emitter and base to collector junction capacities of the transistors thereof. Such charging may better be explained in conjunction with FIG. 4 to which reference is made herein in which the respective transistors are replaced by their delay time equivalent circuits comprising of capacitors and diodes. In FIG. 4, the dotted blocks represent the various transistors with like numerals representing like elements, and letters *e*, *b* and *c* representing emitter, base and collector electrodes respectively. As seen from FIG. 4, due to the displacement currents in transistors Q2B and Q2N indicated by arrows 51 and 52 respectively, current, indicated by arrows 53 and 54 will flow to transistors Q1B and Q1N respectively, so as to forward bias the base to emitter junction thereof. This flow of base junction displacement current indicated in transistor Q1B by arrows 53 and in Q1N by arrows 54 will initiate the simultaneous turn ON of the two transistors, as well as their complementary paired transistors (Q2B and Q2N). Thus the pair of transistors in each stage will be switched to their conducting state. Successful turn ON of the series connected pairs of transistors may further be enhanced by the addition of external capacitors to increase or supplement displacement current, normally associated with the junction capacitance of the transistors. The displacement current may be expressed as, $$i_d=C\frac{dV}{dt} \qquad (1)$$

where $i_d$ represents displacement current, C is the capacitance and $dV/dt$ represents the rate of change of voltage. Thus, for any given rate of change of voltage, the displacement current may be increased by increasing the capacitance of the particular transistor.

In the embodiment of the invention diagrammed in FIGS. 3 and 4, turn OFF, or switching the transistors to their nonconducting state, may be accomplished by the application of a turn OFF pulse to the primary windings 32 of transformer T2. The turn OFF pulse is chosen to be of a polarity, so that the end of secondary winding 36, indicated by dot 38, is positive. Since this end is directly connected to the emitter electrode of NPN transistor Q1N, the base current of this transistor is reduced, due to the flow of current through the emitter base junction thereof. Consequently, the product of the current gain of transistors Q1N and Q2N is reduced below that value necessary to maintain the two transistors in their conductive state and, the two transistors revert to their nonconductive state. As a result, a high impedance is impressed across stage N, thereby reducing the current in the remaining series connected stages.

From the foregoing description, it should thus be appreciated that in accordance with the tecahings of the present invention, the transistors in the various circuit stages of the switching circuit of the invention may be switched to their conductive state by increasing the product of the current gain in one or more of the stages to be equal to unity or greater. This may be accomplished by supplying a turn ON pulse to one or more of the stages to increase the current gain therein. However, once the gain is increased and all the stages are switched to their conductive state as hereinbefore described, the stages remain in such state irrespective of the duration of the turn ON pulse. The duration of the latter mentioned pulse need only be long enough to insure the proper switching of one or more of the stages to which it is applied. Furthermore, it should be appreciated that the turn ON pulse may be applied to any one of the stages of the circuit. For example, in the embodiment shown in FIG. 2, the turn ON pulse is applied to the secondary winding 24, which is in series with the voltage source 12, as well as with all of the circuit stages, while in the embodiment shown in FIG. 3, the turn ON pulse is supplied to the first stage A.

Similarly, the switching of the transistors to their nonconductive state is accomplished by applying a turn OFF pulse so as to reduce the product of the current gain in at least one of the stages to below unity. The turn OFF pulse may be applied to one or more of the stages. For example, in the embodiment shown in FIG. 2, the turn OFF pulse is applied to stage A, being the first in the series of stages, while in the embodiment shown in FIG. 3, the turn OFF pulse is applied to the last stage designated by letter N.

From the foregoing, it should thus be appreciated that the novel switching circuit of the present invention does not require that every stage be individually supplied with input drive power, with its separate drive coupling network in order to switch on the transistors therein to their conductive state. Rather, in the circuit of the present invention the drive power necessary to switch the transistors to their conductive or nonconductive states need be supplied only during the rise and fall time intervals when the transistors change their state of conduction and not during the entire period when the transistors are in either of the two states. Furthermore, in accordance with the teachings of the present invention, each transistor is driven into conduction or saturation independent of its own current gain. Therefore, matching of transistors on the basis of identical gain versus current characteristics or identical input impedance characteristics is not required. Also, since all the transistors are driven into saturation, the output pulse shape, i.e., the shape of the voltage applied to the load, is independent of the shape of the input turn ON pulse. Furthermore, the ability to select the stage or stages to which the turn ON and turn OFF pulses are applied, greatly simplifies the design problems of the circuit. Still a further advantage of the circuit of the present invention is the relatively uniform distribution of the total voltage of source 12 between the various stages so that the full switched voltage does not appear across any one stage, which is typical of some prior art switching circuit, resulting in the failure of one or more of the transistors.

Figure 5:
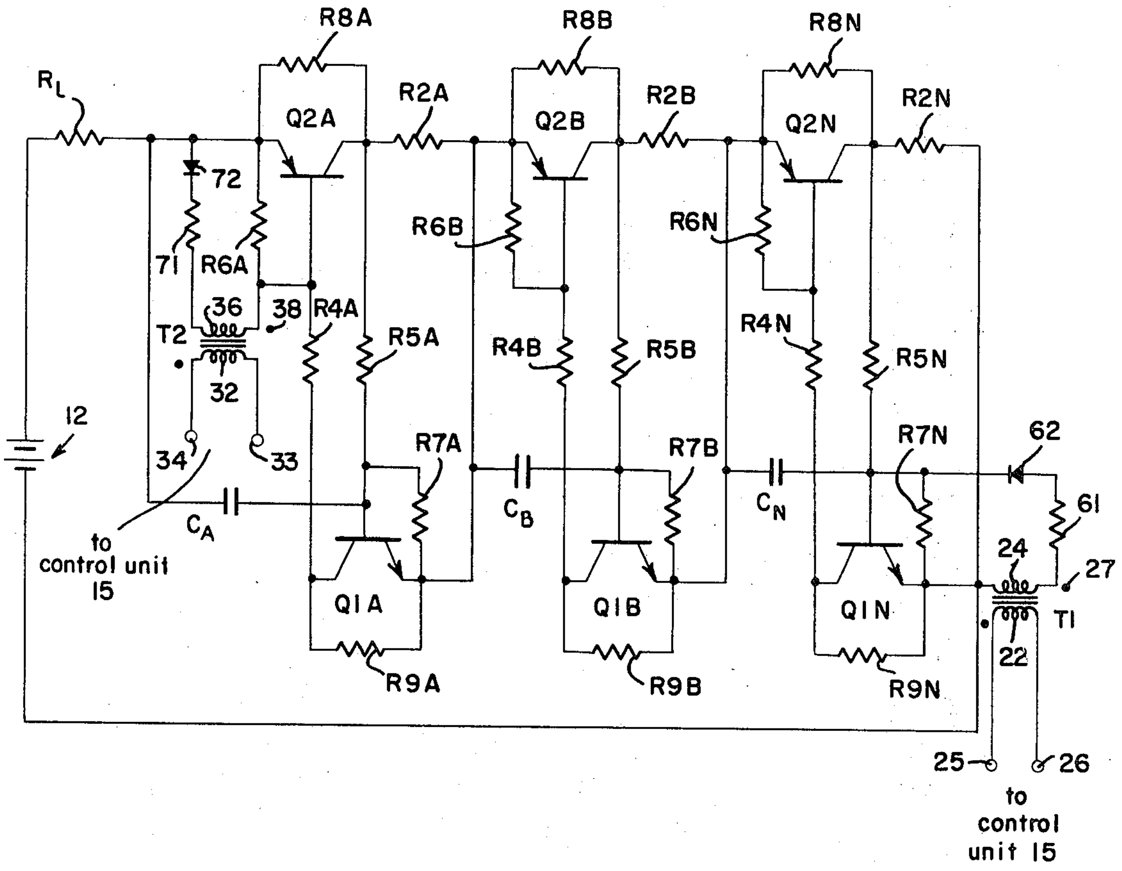
FIG. 5 is a schematic diagram of yet another embodiment of the invention.

Herebefore, the invention has been described in conjunction with turn ON, or switching of the transistor to their conducting state by means of avalanche turn ON (FIG. 2), or by means of the transistor junction capacitance displacement current explained in conjunction with FIGS. 3 and 4. An embodiment of the invention, in which turn ON is accomplished, by means of increasing the base current of one of the transistors, is diagrammed in FIG. 5, to which reference is made herein, wherein like elements are designated by like numerals. In the embodiment shown in FIG. 5, the base and emitter of each PNP transistor are interconnected by means of a resistor R6 followed by the respective stage letter designation, while the base and emitter electrodes of each NPN transistor are interconnected by means of a resistor R7. The function of these resistors is to control the amount of transistor leakage current during the OFF state to an acceptable level. Resistors R3A, R3B, and R3N, shown in the embodiments diagrammed in FIGS. 2 and 3, the function of which is to swamp out or compensate for variations occurring in practice between OFF state impedance levels for each of the circuit stages, are replaced in the embodiment shown in FIG. 5 by two resistors, such as R8A and R9A, shown shunted across the collector emitter electrodes of transistor Q2A and Q1A respectively. In addition, in the embodiment shown in FIG. 5, external capacitors $C_A$, $C_B$ and $C_N$ are shown connected from PNP emitter terminal to NPN base terminal. Their function is to increase the capacitance thereon and therefore the displacement current as hereinbefore described in conjunction with Equation 1.

The secondary winding of transformer T1 is shown connected between the emitter of transistor Q1N of the last stage and the base thereof through a resistor 61 and a diode 62, so that when a turn ON pulse of proper polarity is applied to the primary winding 22, current flows from the positive end of winding 24 indicated by dot 27 through resistor 61 and diode 62 into the base of transistor Q1N, to increase the base current thereof, and thereby increase the gain of the two transistors to switch them to their conductive state. On the other hand, the secondary winding of transformer T2, used to provide the turn OFF pulse, is shown connected between the base of transistor Q2A of stage A and to the emitter thereof through a resistor 71 and a diode 72. The polarity of the OFF pulse, supplied from control unit 15 (FIG. 1), is such that the end of secondary winding 36, indicated by dot 38, is positive, thereby reducing the current through the emitter to base junction of transistor Q2A to reduce the current gain thereof. Consequently, the product of the current gain in stage A is reduced to below unity, switching the transistors of the stage as well as the transistors in the other stages to their nonconductive state. Thus, whereas in the embodiment shown in FIG. 3 turn ON and turn OFF are accomplished by applying pulses to the first and last stages, in the embodiment diagrammed in FIG. 5, turn ON and turn OFF are accomplished by pulses applied to the last and first stages respectively.

In the foregoing description, the invention has been described in conjunction with a voltage source 12 and a resistive load $R_L$, with which the switching circuit is connected in series so as to control the voltage from the source applied to the load as a function of the impedance across the switching circuit. It should be appreciated however, that the invention is not limited to such specific applications only. Rather, the invention may be employed in any arrangement where the switching of high voltage or energy is required and controllable as a function of the impedance across the switching circuit. For example, the novel switching of the present invention may be incorporated in a pulse forming circuit schematically diagrammed in FIG. 6, to which reference is made herein, wherein the switching circuit of the present invention is represented by the normally open switch $S_1$. Such a pulse forming circuit includes a voltage source 81 such as a battery which charges a pulse forming network generally designated PFN through a charging inductor or choke $L_C$ and a charging diode $CR_1$. Such a circuit is also shown to include pulse transformer $T_P$, having its secondary winding 83 connected across a load $R_X$, while its primary winding 84 is connected between the pulse forming network (PFN) and one terminal of the voltage source 81. The switch $S_1$ is shown connected across the pulse forming network and the primary winding 84.

As is appreciated by those familiar with the art, as long as switch $S_1$ is open, the pulse forming network PFN is charged through choke $L_C$ and diode $CR_1$ from the source 81. Then, after sufficient charge has built up, by closing switch $S_1$, the pulse forming network discharges through the switch and the primary winding 84, impressing a pulse or potential difference across load $R_X$ through the secondary winding 83. As herebefore stated, the switch $S_1$ may be replaced by the novel switching circuit of the present invention. As long as the transistors are in their nonconducting state, the switch may be assumed to be open, enabling the charge to be built up in the pulse forming network. Then, in response to a turn ON signal supplied from any appropriate source, the transistors may be switched to their conducting state providing a low impedance across the circuit, and thereby enabling the pulse forming network to discharge through the primary winding 84 and provide the load with the appropriate pulse.

By properly mismatching the load with respect to the pulse forming circuitry, sufficient energy may be reflected through the secondary winding 83 across the primary winding 84 in a polarity so that substantially a turn OFF pulse may be provided to the switching network to switch the various transistors therein to their nonconductive state. Thus, a turn OFF pulse is indirectly provided to switch the transistors to their nonconductive state and enable the pulse forming network to be recharged again for applying a subsequent pulse to the load $R_X$. Thus, whereas an active turn ON pulse is required to switch the transistors of the circuits to their conductive state, the turn OFF pulse is indirectly supplied by the energy, reflected from the load $R_X$.

There has accordingly been shown and described herein a novel switching circuit, for controlling voltage applied from a source to a load. The circuit comprises a plurality of stages, each including a pair of transistors arranged to operate in a regenerative closed loop, whereby the transistors are switched to their conductive state when the product of the current gain thereof is equal to or greater than a predetermined value, such as unity. Once one or more of the stages are switched to their conductive state, all the other stages are similarly switched to such state, providing a relatively low impedance across the switching network. The transistors remain in their conductive state until the product of the current gain in one or more of the stages is decreased below the predetermined value, such as unity, thereby switching the transistors in those stages to their nonconductive state, which in turn causes the transistors in the other stages to similarly switch to their nonconductive state, to provide a relatively high impedance thereacross. Although turning the transistors ON or OFF may be accomplished by means of pulses of predetermined duration, the period during which the transistors remain in one or the other of the conduction states is not dependent on the time duration of the pulses. Rather, due to the regenerative closed loop characteristics of the transistors, they remain in one or the other state of conduction until disturbed by an appropriate turn ON or turn OFF pulse. It is appreciated that those familiar with the art may make modifications and/or substitute equivalents in the embodiments hereinbefore described without departing from the true spirit of the invention. Therefore, all such modifications and/or equivalents are deemed to fall within the scope of the invention as claimed in the appended claims.

What is claimed is:

1. A circuit for controlling energy applied to a load from a source, through said circuit, as a function of the impedance of said circuit, said circuit comprising:

a plurality of serially connected stages, each stage including at least a pair of transistors, each of said transistors having predetermined current gain characteristics, said transistors being switchable between a conductive and a nonconductive state, means connecting said transistors in each pair whereby said transistors are in a conductive state when the product of the current gain thereof is not less than a predetermined value and in a nonconductive state when the product of the current gain is less than said predetermined value;

control means coupled to at least one of said stages for controlling the product of the current gain thereof to control the state of conduction of said transistors and the impedance of each stage, including increasing the impedance, through which energy is applied to the load;

each of said serially connected circuit stages, except said circuit stages coupled to said control means, having only two connection points so that serially connected stages can be connected together for controlling energy without additional connections.

2. The circuit defined in claim 1 wherein each stage comprises at least first and second transistors each having base, emitter and collector electrodes, means connecting the base-emitter electrodes of said first transistor to the collector of said second transistor and the collector electrode of said first transistor to the base and emitter electrodes of said second transistor to form a regenerative closed loop circuit wherein said first and second transistors are in their conducting state when the product of the current gain thereof is not less than unity.

3. The circuit defined in claim 2 wherein said control means includes first control means coupled to at least one of said stages and responsive to a first signal for increasing in response to said first signal the product of the current gain in at least said one stage to at least unity so as to switch the transistors thereof to their conductive state.

4. The circuit defined in claim 3 wherein said control means further increases second control means coupled to one of said stages and responsive to a second signal for reducing the product of the current gain in said stage to less than unity so as to switch the transistors thereof to their nonconductive state.

5. The circuit defined in claim 3 wherein said at least first and second transistors consist of NPN and PNP transistors respectively, said circuit further including a plurality of resistive elements each connected in parallel with another of said circuit stages for providing a predetermined impedance thereacross when the transistors of the stage are in their nonconducting state.

6. The circuit defined in claim 3 wherein said first control means comprises at least one pulse transformer having primary and secondary windings, means for supplying said first control signal to said primary windings, means for connecting said secondary windings to the emitter and base electrodes of one of said transistors to increase the product of the current gain of the pair of transistors in said stage to at least unity by increasing the base current of said transistor to switch said transistors to their conductive state.

7. The circuit defined in claim 6 wherein said second control means comprises at least one pulse transformer having primary and secondary windings, means for applying said second control signal to said primary winding, and means for connecting said secondary winding to one of the transistors of said stage to reduce the product of the current gain of the transistors by reducing the base current of the transistor connected to said secondary winding.

8. A circuit operable in either a first or a second stable state for providing a first or a second impedance thereacross, respectively, said second impedance being substantially larger than said first impedance, said circuit comprising:

a plurality of circuit stages interconnected in at least one serial group, each stage including a pair of multielectrode semiconductive elements, each switchable between said first stable state and said second stable state and having predetermined current gain characteristics, means connecting said pair of elements to form a regenerative closed loop whereby said pair of multielectrode semiconductive elements are in their first state when the product of the gain thereof is not less than a preselected value and in their second state when the product of the gain thereof is less than said value;

control means coupled to at least one of said stages for controlling the product of the current gain thereof to control the impedance thereacross and the impedance of the other stages, including increasing the impedance, as a function of the state thereof;

each of said circuit stages, except said circuit stages coupled to said control means, having only two connection points so that serially connected circuit stages are connected at said connection points.

9. The circuit defined in claim 8 wherein the pair of elements in each stage comprises a PNP and an NPN transistor, each having emitter, base and collector electrodes, said stage including means connecting the base and emitter electrodes of one transistor to the collector electrode of the other transistor to form said regenerative closed loop whereby said transistors are switched to their conductive state when the product of the current gain thereof is not less than unity.

10. The circuit defined in claim 9 wherein said control means includes first control means coupled to at least one of said stages and responsive to a first signal for increasing in response to said first signal the current gain in at least said one stage to at least unity so as to switch the transistors thereof to their conductive state.

11. The circuit defined in claim 10 wherein said first control means comprises at least one pulse transformer having primary and secondary windings, means for supplying said first control signal to said primary windings, means for connecting said secondary windings to the emitter and base electrodes of one of said transistors to increase the product of the current gain of the pair of transistors in said stage to at least unity by increasing the base current of said transistor to switch said transistors to their conductive state.

12. The circuit defined in claim 11 wherein said control means further includes second control means coupled to one of said stages and responsive to a second signal for reducing the product of the current gain in said stage to less than unity so as to switch the transistors thereof to their nonconductive state.

13. The circuit defined in claim 12 wherein said second control means comprises at least one pulse transformer having primary and secondary windings, means for applying said second control signal to said primary winding, and means for connecting said secondary winding to one of the transistors of said stage to reduce the product of the current gain of the transistors by reducing the base current of the transistor connected to said secondary winding.

References Cited

UNITED STATES PATENTS

| | | | |
|---|---|---|---|
| 3,100,268 | 8/1962 | Foote | 307—252 |
| 3,109,940 | 11/1963 | Baude | 307—253 |
| 3,181,010 | 4/1965 | Cotten et al. | 307—255 |

OTHER REFERENCES

Pub. I: "Electronics," pages 66–73, article by R. A. Stasior, Aug. 10, 1964.

Pub. II: "Four-Layer Diode Pulse Modulators," in solid state design, July 1962, pages 53–55.

Pub. III: "Shockley 4-Layer Diode Circuit Applications," "Pulse Modulator," March 1961.

DONALD D. FORRER, Primary Examiner

S. D. MILLER, Assistant Examiner

U.S. Cl. X.R.

307—252, 258, 288, 313